(12) United States Patent
Tung et al.

(10) Patent No.: US 11,564,336 B2
(45) Date of Patent: Jan. 24, 2023

(54) ELECTRONIC DEVICE

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/349,232

(22) Filed: Jun. 16, 2021

(65) Prior Publication Data

US 2022/0394877 A1 Dec. 8, 2022

(30) Foreign Application Priority Data

Jun. 3, 2021 (CN) .......................... 202110617654.9

(51) Int. Cl.
*H05K 7/20* (2006.01)

(52) U.S. Cl.
CPC ......... *H05K 7/2079* (2013.01); *H05K 7/2039* (2013.01); *H05K 7/20309* (2013.01); *H05K 7/20318* (2013.01)

(58) Field of Classification Search
CPC .................. H05K 7/20318; H05K 7/20809
See application file for complete search history.

(56) References Cited

U.S. PATENT DOCUMENTS

| 7,957,132 | B2* | 6/2011 | Fried | G06F 1/20 |
| | | | | 361/694 |
| 8,422,218 | B2* | 4/2013 | Fried | H05K 7/20809 |
| | | | | 361/695 |
| 8,724,323 | B2* | 5/2014 | Chang | G06F 1/20 |
| | | | | 361/710 |
| 9,261,310 | B2* | 2/2016 | Fried | F28D 15/0266 |
| 11,337,317 | B2* | 5/2022 | Yang | H05K 5/0213 |
| 2007/0125523 | A1* | 6/2007 | Bhatti | H05K 7/20772 |
| | | | | 165/80.4 |

(Continued)

*Primary Examiner* — Robert J Hoffberg
(74) *Attorney, Agent, or Firm* — Locke Lord LLP; Tim Tingkang Xia, Esq.

(57) ABSTRACT

An electronic device configured to be connected to external heat dissipation device and including chassis, heat source and heat dissipation assembly. The heat source is disposed in the chassis. The heat dissipation assembly includes evaporator, condenser and fin assembly. The evaporator is in thermal contact with the heat source. The condenser has outer surface, condensation space and liquid-cooling space. The outer surface faces away from the condensation space and the liquid-cooling space. The condensation space and the liquid-cooling space are not in fluid communication with each other. The condensation space is in fluid communication with the evaporator. The liquid-cooling space is configured to be in fluid communication with the external heat dissipation device. The fin assembly is in thermal contact with the condenser and protrudes from the outer surface of the condenser along direction away from the condensation space or the liquid-cooling space.

3 Claims, 9 Drawing Sheets

(56) References Cited

U.S. PATENT DOCUMENTS

| | | | |
|---|---|---|---|
| 2017/0234623 A1* | 8/2017 | Fried | H05K 7/20809 |
| | | | 165/104.26 |
| 2021/0149461 A1* | 5/2021 | Tung | H05K 7/20318 |
| 2022/0154985 A1* | 5/2022 | Tung | F28D 15/0266 |
| 2022/0155022 A1* | 5/2022 | Tung | F28D 15/025 |

* cited by examiner

ELECTRONIC DEVICE

CROSS-REFERENCE TO RELATED APPLICATIONS

This non-provisional application claims priority under 35 U.S.C. § 119(a) on Patent Application No(s). 202110617654.9 filed in China, on Jun. 3, 2021, the entire contents of which are hereby incorporated by reference.

BACKGROUND OF THE INVENTION

Technical Field of the Invention

The invention relates to an electronic device, more particularly to an electronic device including a heat dissipation assembly.

Description of the Related Art

In general, a server cabinet or server rack accommodating a plurality of servers is placed in a room in which one or more air conditioners are installed. In addition, the greater the temperature difference between the cold air flowing into the server cabinet and the hot air flowing out of the server cabinet is, the more effectively the air conditioners cool the servers in the server cabinet. Thus, in order to increase such temperature difference, a liquid-cooling plate is disposed on an air outlet of the server cabinet to cool the hot air flowing out of the servers.

However, the liquid-cooling plate is generally disposed on the air outlet of the cabinet, such that it is required to be removed when any one of the servers is needed to be maintained. Therefore, the hot air flowing out of the remaining servers that are still in operation is unable to be cooled by the liquid-cooling plate during such maintenance, which decreases the temperature difference between the cold air flowing into the server cabinet and the hot air flowing out of the server cabinet, thereby adversely affecting the heat dissipation efficiency of other servers.

SUMMARY OF THE INVENTION

The invention is to provide an electronic device to maintain the heat dissipation efficiency of the servers in the server cabinet.

One embodiment of this invention provides an electronic device configured to be connected to an external heat dissipation device and including a chassis, a heat source and a heat dissipation assembly. The heat source is disposed in the chassis. The heat dissipation assembly includes an evaporator, a condenser and a fin assembly. The evaporator is in thermal contact with the heat source. The condenser has an outer surface, a condensation space and a liquid-cooling space. The outer surface faces away from the condensation space and the liquid-cooling space. The condensation space and the liquid-cooling space are not in fluid communication with each other. The condensation space is in fluid communication with the evaporator. The liquid-cooling space is configured to be in fluid communication with the external heat dissipation device. The fin assembly is in thermal contact with the condenser and protrudes from the outer surface of the condenser along a direction away from the condensation space or the liquid-cooling space.

Another embodiment of this invention provides an electronic device configured to be connected to an external heat dissipation device including a chassis, a heat source and a heat dissipation assembly. The heat source is disposed on the chassis. The heat dissipation assembly includes an evaporator, a tubing, a liquid-cooling plate and a fin assembly. The evaporator is in thermal contact with the heat source. The tubing includes an evaporation portion and a condensation portion. The evaporation portion is in fluid communication with the condensation portion and is in thermal contact with the evaporator. The liquid-cooling plate is disposed on the chassis and is spaced apart from the heat source. The liquid-cooling plate has an outer surface and a liquid-cooling space. The outer surface faces away from the liquid-cooling space. The liquid-cooling space is configured to be in fluid communication with the external heat dissipation device. The condensation portion of the tubing is located in the liquid-cooling space. The fin assembly is in thermal contact with the liquid-cooling plate and protrudes from the outer surface of the liquid-cooling plate along a direction away from the liquid-cooling space.

According to the electronic device disclosed by the above embodiments, the fin assembly protrudes from the outer surface of the liquid-cooling plate or the outer surface of the condenser along a direction away from the condensation space or the liquid-cooling space. Thus, the heat dissipation assembly not only can cool the working fluid in the condensation portion or the condensation space via the liquid coolant in the liquid-cooling space, but also can cool the hot air in the chassis via the fin assembly. Since the hot air in the chassis is cooled by the fin assembly that is disposed in the chassis, the maintenance of one electronic device accommodated in the cabinet does not disturb the cooling operation of the fin assemblies of other electronic devices accommodated in the cabinet. Also, there is no need to dispose a liquid-cooling plate on the air outlet of the cabinet. Accordingly, the heat dissipation efficiency of the cabinet accommodating the electronic device is prevented from being reduced during the maintenance of the electronic device.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
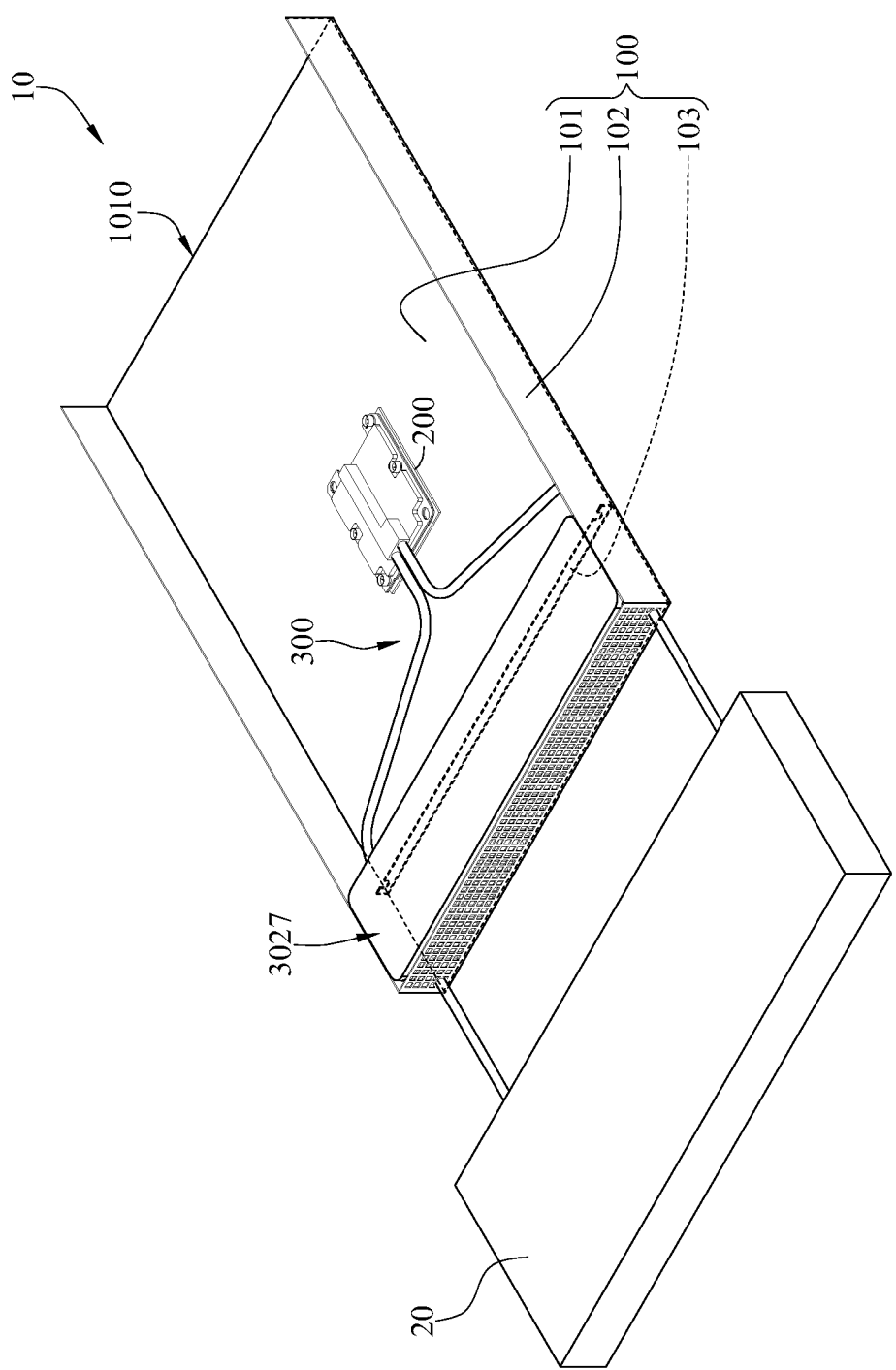
FIG. 1 is a perspective view of an electronic device according to a first embodiment of the invention and an external heat dissipation device.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
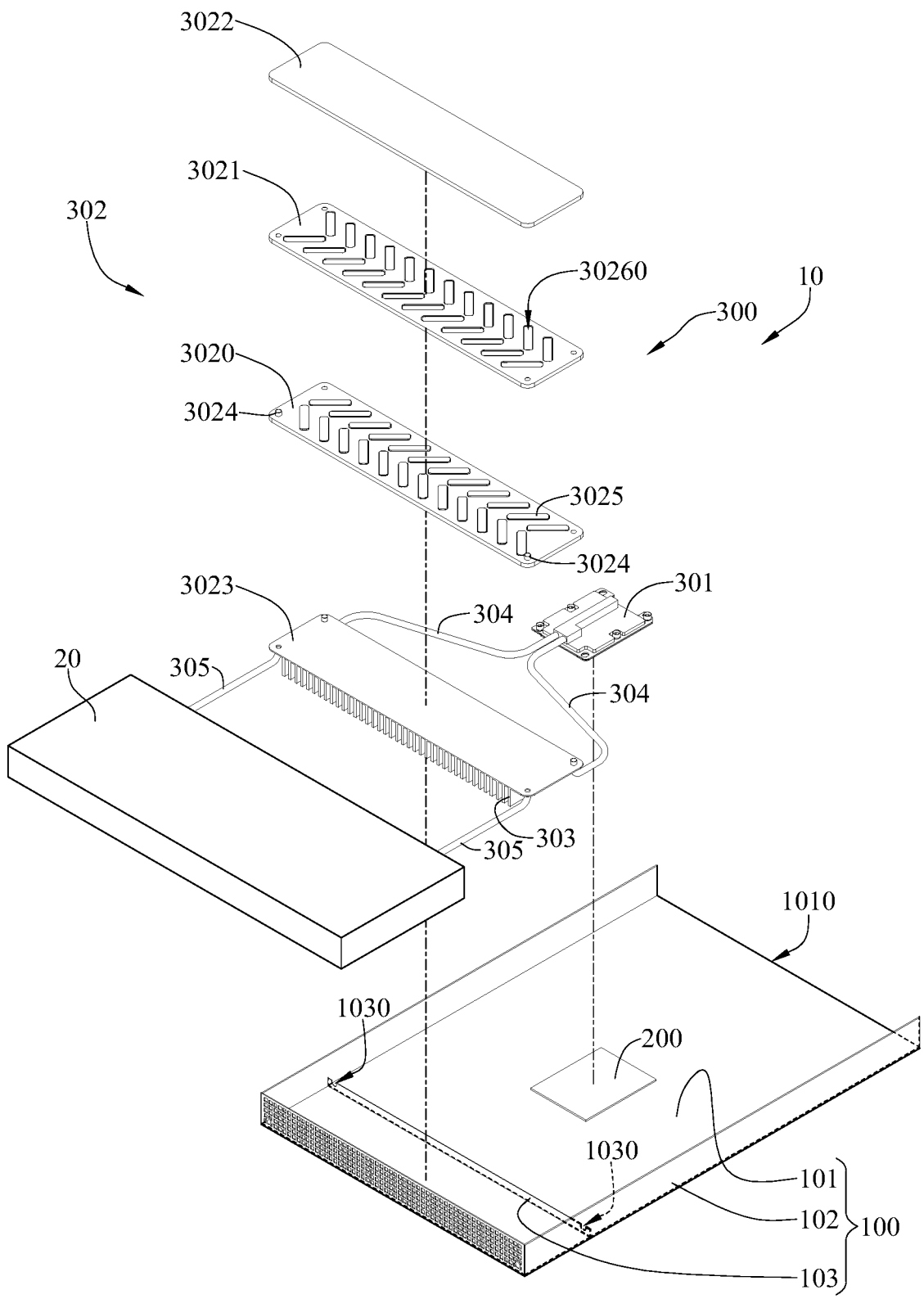
FIG. 2 is an exploded view of the electronic device and the external heat dissipation device in FIG. 1.
Figure 3:
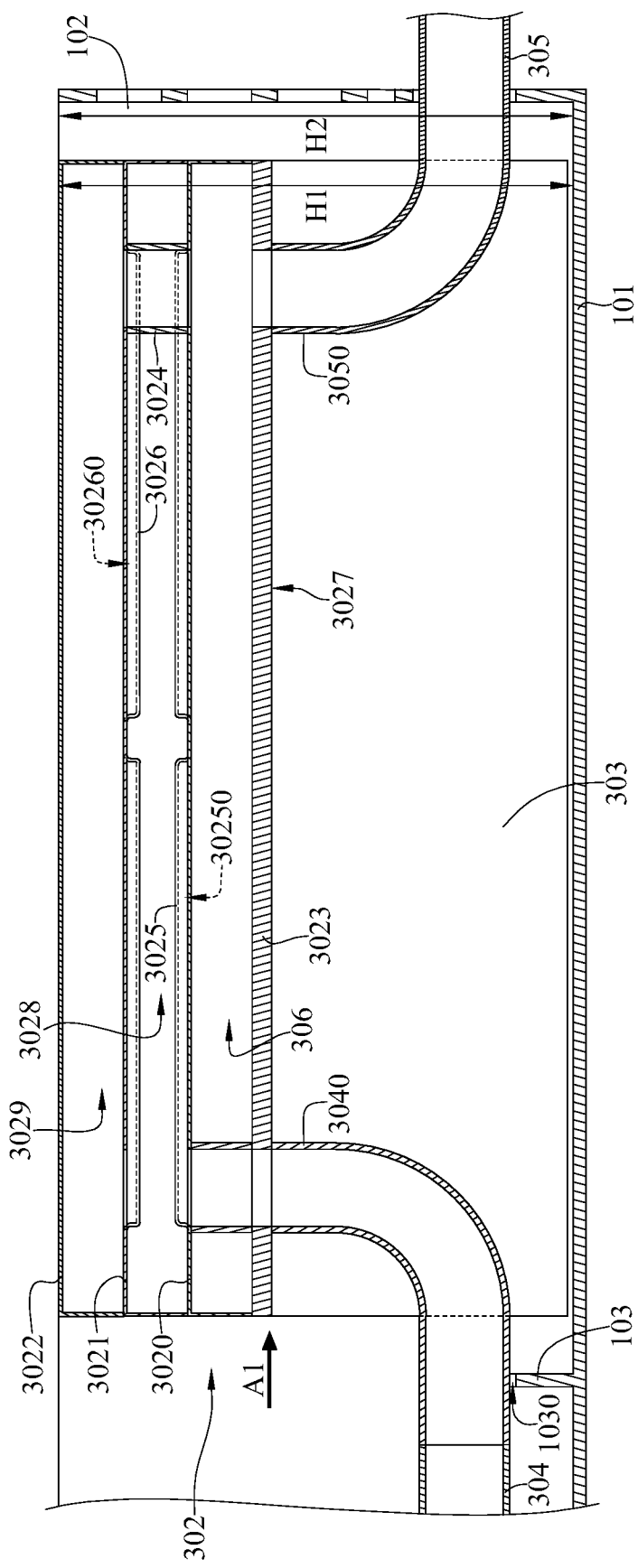
FIG. 3 is a partially enlarged side cross-sectional view of the electronic device in FIG. 1.

Please refer to FIGS. 1 to 3, where FIG. 1 is a perspective view of an electronic device 10 according to a first embodiment of the invention and an external heat dissipation device 20, FIG. 2 is an exploded view of the electronic device 10 and the external heat dissipation device 20 in FIG. 1, and FIG. 3 is a partially enlarged side cross-sectional view of the electronic device 10 in FIG. 1.

The electronic device 10 is configured to be connected to the external heat dissipation device 20, and includes a chassis 100, a heat source 200 and a heat dissipation assembly 300. The electronic device 10 is, for example, a server, and is configured to be accommodated in a cabinet (not shown). In this embodiment, the chassis 100 includes a bottom plate 101, a wall 102 and a partition 103. The wall 102 stands on a peripheral edge 1010 of the bottom plate 101 and is, for example, U-shaped. The partition 103 stands on the bottom plate 101 and is connected to two parts of the wall 102 that are parallel to each other. The heat source 200 is disposed on the bottom plate 101 and is, for example, a central processing unit or a graphic processing unit.

In this embodiment, the heat dissipation assembly 300 includes an evaporator 301, a condenser 302, a fin assembly 303, two first tubes 304 and two second tubes 305. The evaporator 301 is in thermal contact with a side of the heat source 200 that is located away from the bottom plate 101. In this embodiment, the condenser 302 is a stack structure and includes a first thermally conductive plate 3020, a second thermally conductive plate 3021, a third thermally conductive plate 3022, a fourth thermally conductive plate 3023, a plurality of connecting tubes 3024, a plurality of first protrusions 3025 and a plurality of second protrusions 3026. In addition, the condenser 302 has an outer surface 3027, a condensation space 3028, a first liquid-cooling space 3029 and a second liquid-cooling space 306.

The first thermally conductive plate 3020, the second thermally conductive plate 3021 and the third thermally conductive plate 3022 are sequentially stacked on one another, and the fourth thermally conductive plate 3023 is stacked on a side of the first thermally conductive plate 3020 that is located away from the second thermally conductive plate 3021 That is, the fourth thermally conductive plate 3023, the first thermally conductive plate 3020, the second thermally conductive plate 3021 and the third thermally conductive plate 3022 are sequentially stacked.

The first thermally conductive plate 3020, the second thermally conductive plate 3021, the third thermally conductive plate 3022 and the fourth thermally conductive plate 3023 together form the outer surface 3027. The first liquid-cooling space 3029 is formed between the second thermally conductive plate 3021 and the third thermally conductive plate 3022. The condensation space 3028 is formed between the first thermally conductive plate 3020 and the second thermally conductive plate 3021. The second liquid-cooling space 306 is formed between the fourth thermally conductive plate 3023 and the first thermally conductive plate 3020. The condensation space 3028 is located between the first liquid-cooling space 3029 and the second liquid-cooling space 306. In addition, the outer surface 3027 faces away from the condensation space 3028, the first liquid-cooling space 3029 and the second liquid-cooling space 306.

In this embodiment, the condensation space 3028 is in fluid communication with the evaporator 301 via the two first tubes 304. As shown in FIG. 3, an end portion 3040 of each first tube 304 that is located away from the evaporator 301 extends from a side of the fourth thermally conductive plate 3023 of the condenser 302 that is located close to the bottom plate 101 into the condenser 302 so as to be in fluid communication with the condensation space 3028. In addition, in this embodiment, the first liquid-cooling space 3029 and the second liquid-cooling space 306 are not in fluid communication with the condensation space 3028, and the first liquid-cooling space 3029 is in fluid communication with the second liquid-cooling space 306 via the connecting tubes 3024. Specifically, two opposite ends of each connecting tube 3024 are respectively in fluid communication with the first liquid-cooling space 3029 and the second liquid-cooling space 306, and the first liquid-cooling space 3029 and the second liquid-cooling space 306 are connected in parallel. The connecting tubes 3024 are disposed through but not in fluid communication with the condensation space 3028. The second liquid-cooling space 306 is configured to be in fluid communication with the external heat dissipation device 20 via the two second tubes 305, such that the first liquid cooling space 3029 is also in fluid communication with the external heat dissipation device 20 via the connecting tubes 3024, the second liquid-cooling space 306 and the two second tubes 305. As shown in FIG. 3, an end portion 3050 of each second tube 305 that is located away from the external heat dissipation device 20 extends from a side of the fourth thermally conductive plate 3023 of the condenser 302 that is located close to the bottom plate 101 into the condenser 302 so as to be in fluid communication with the second liquid-cooling space 306.

In this embodiment, the first thermally conductive plate 3020, the second thermally conductive plate 3021, the third thermally conductive plate 3022 and the fourth thermally conductive plate 3023 are made of, for example, metal.

The partition 103 is located between the heat source 200 and the condenser 302, so as to prevent a liquid coolant (not shown) leaked from the condenser 302 from further flowing to the heat source 200. In this embodiment, the partition 103 has two recesses 1030 recessing from a side of the partition 103 that is located away from the bottom plate 101. The two first tubes 304 are respectively located in the two recesses 1030.

The fin assembly 303 is in thermal contact with the fourth thermally conductive plate 3023 of the condenser 302 and protrudes from the outer surface 3027 of the condenser 302 along a direction away from the second liquid-cooling space 306. In this embodiment, the fin assembly 303 protrudes from a side of the fourth thermally conductive plate 3023 of the condenser 302 that is located close to the bottom plate 101 and extends to the bottom plate 101, such that the condenser 302 and the bottom plate 101 are spaced apart from each other. As shown in FIG. 3, in this embodiment, the fin assembly 303 raises the condenser 302 relative to the bottom plate 101, and a height H1 of a side of the third thermally conductive plate 3022 of the condenser 302 that is located away from the bottom plate 101 relative to the bottom plate 101 is equal to a height H2 of a side of the wall 102 that is located away from the bottom plate 101 relative to the bottom plate 101. A hot air A1 is configured to flow through the fin assembly 303 and thus is cooled by the fin assembly 303, where the hot air A1 is blew by a fan (not shown) disposed inside or outside the electronic device 10 and has absorbed the heat accumulated in the electronic device 10.

The first protrusions 3025 protrude from the first thermally conductive plate 3020 towards the condensation space 3028. In this embodiment, the first protrusions 3025 are formed by, for example, performing stamping process on the first thermally conductive plate 3020, such that the first thermally conductive plate 3020 has a plurality of recesses 30250 located in the second liquid-cooling space 306. The second protrusions 3026 protrude from the second thermally conductive plate 3021 towards the condensation space 3028. In this embodiment, the second protrusions 3026 are formed by, for example, performing stamping process on the second thermally conductive plate 3021, such that the second thermally conductive plate 3021 has a plurality of recesses 30260 located in the first liquid-cooling space 3029.

A working fluid (not shown) is configured to circulate among the evaporator 301, the first tubes 304 and the condensation space 3028, where the working fluid is, for example, a refrigerant. The liquid coolant (not shown) is configured to circulate among the first liquid-cooling space 3029, the second liquid-cooling space 306, the connecting tubes 3024 and the external heat dissipation device 20, where the liquid coolant is, for example, water. After the working fluid absorbs heat in the evaporator 301 which is transferred from the heat source 200, the working fluid vaporizes and then flows to the condensation space 3028 via the one of the first tubes 340. The liquid coolant flowing in the first liquid-cooling space 3029 and the second liquid-cooling space 306 cools the vaporized working fluid flowing into the condensation space 3028 so that the vaporized working fluid is condensed into liquid form. Then, the liquid working fluid flows back to the evaporator 301 via the other first tube 340. On the other hand, the liquid coolant absorbing the heat from the working fluid flows to the external heat dissipation device 20 and is cooled by the external heat dissipation device 20. In this embodiment, the working fluid and the liquid coolant flow in the condenser 302 respectively along two opposite directions, such that the heat transferring efficiency between the working fluid and the liquid coolant is enhanced.

In other embodiments, the condenser may not be stack structure and may be an integrated structure having the condensation space and the liquid-cooling space that are not in fluid communication with each other. In other embodiments, the condenser may not have the second liquid-cooling space and may merely have the first liquid-cooling space.

In other embodiments, the height of a side of the third thermally conductive plate of the condenser that is located away from the bottom plate relative to the bottom plate may be smaller than the height of a side of the wall that is located away from the bottom plate relative to the bottom plate.

In other embodiments, the end portion of each first tube that is located away from the evaporator may extend from a side of the third thermally conductive plate of the condenser that is located away from the bottom plate into the condenser, and the end portion of each second tube that is located away from the external heat dissipation device may extend from a side of the third thermally conductive plate that is located away from the bottom plate into the condenser.

In other embodiments, the partition may not include the recesses and the first tube may be spaced apart from the partition. In still other embodiments, the chassis may not include the partition.

In other embodiments, the first protrusions may protrude from the first thermally conductive plate towards the second liquid-cooling space. In still other embodiments, the condenser may not include the first protrusions. In other embodiments, the second protrusions may protrude from the second thermally conductive plate towards the first liquid-cooling space. In still other embodiments, the condenser may not include the second protrusions.

In other embodiments, the condenser may include a single connecting tube. Furthermore, in other embodiments, the connecting tubes may not be disposed through the condensation space and may be located outside the condensation space.

Figure 4:
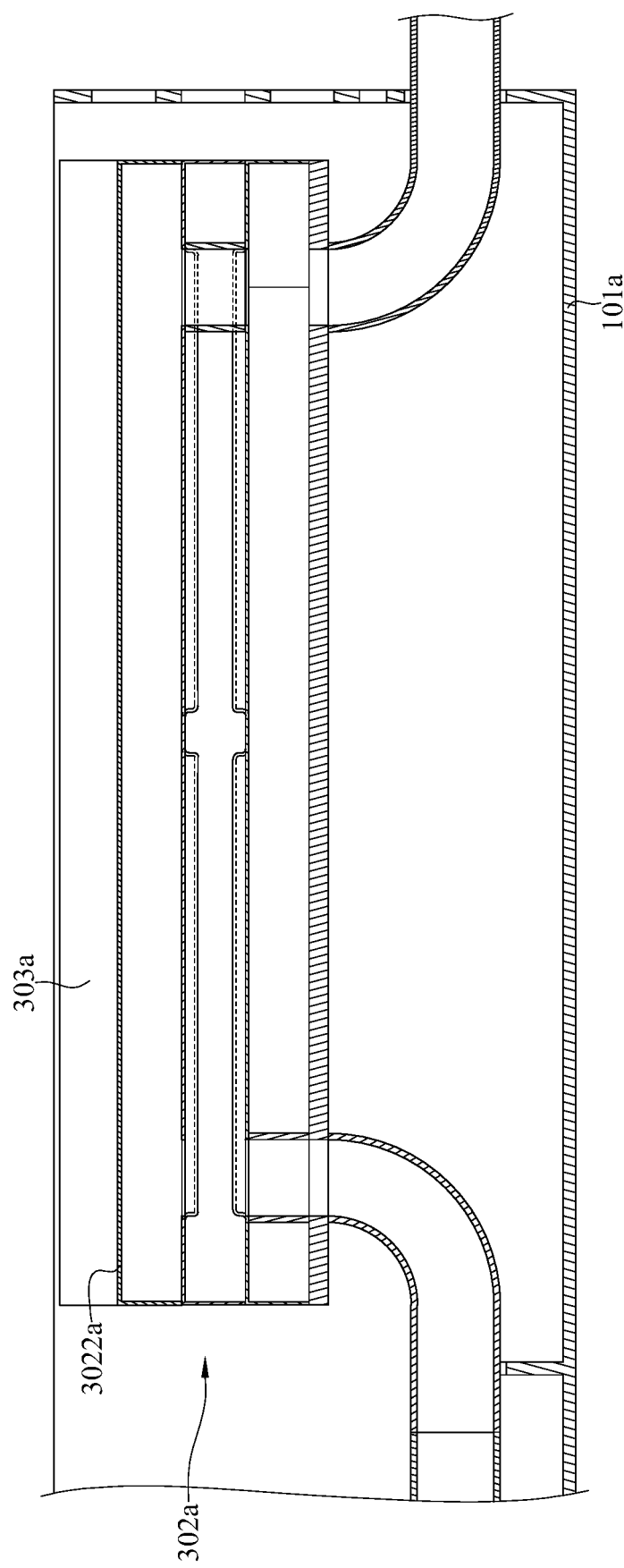
FIG. 4 is a partially enlarged side cross-sectional view of an electronic device according to a second embodiment of the invention.

The fin assembly 303 is not limited to protrude from a side of the fourth thermally conductive plate 3023 of the condenser 302 that is located close to the bottom plate 101. Please refer to FIG. 4, there is shown a partially enlarged side cross-sectional view of an electronic device according to a second embodiment of the invention. The main difference between the electronic device shown in FIG. 4 and the electronic device shown in FIGS. 1 to 3 is the position of the fin assembly. Thus, only such difference will be described hereinafter, and the remaining part of the electronic device shown in FIG. 4 can be understood through the descriptions made by referring to FIGS. 1 to 3 and thus are not repeatedly described. In this embodiment, the fin assembly 303a protrudes from a side of the third thermally conductive plate 3022a of the condenser 302a that is located away from the bottom plate 101a.

Figure 5:
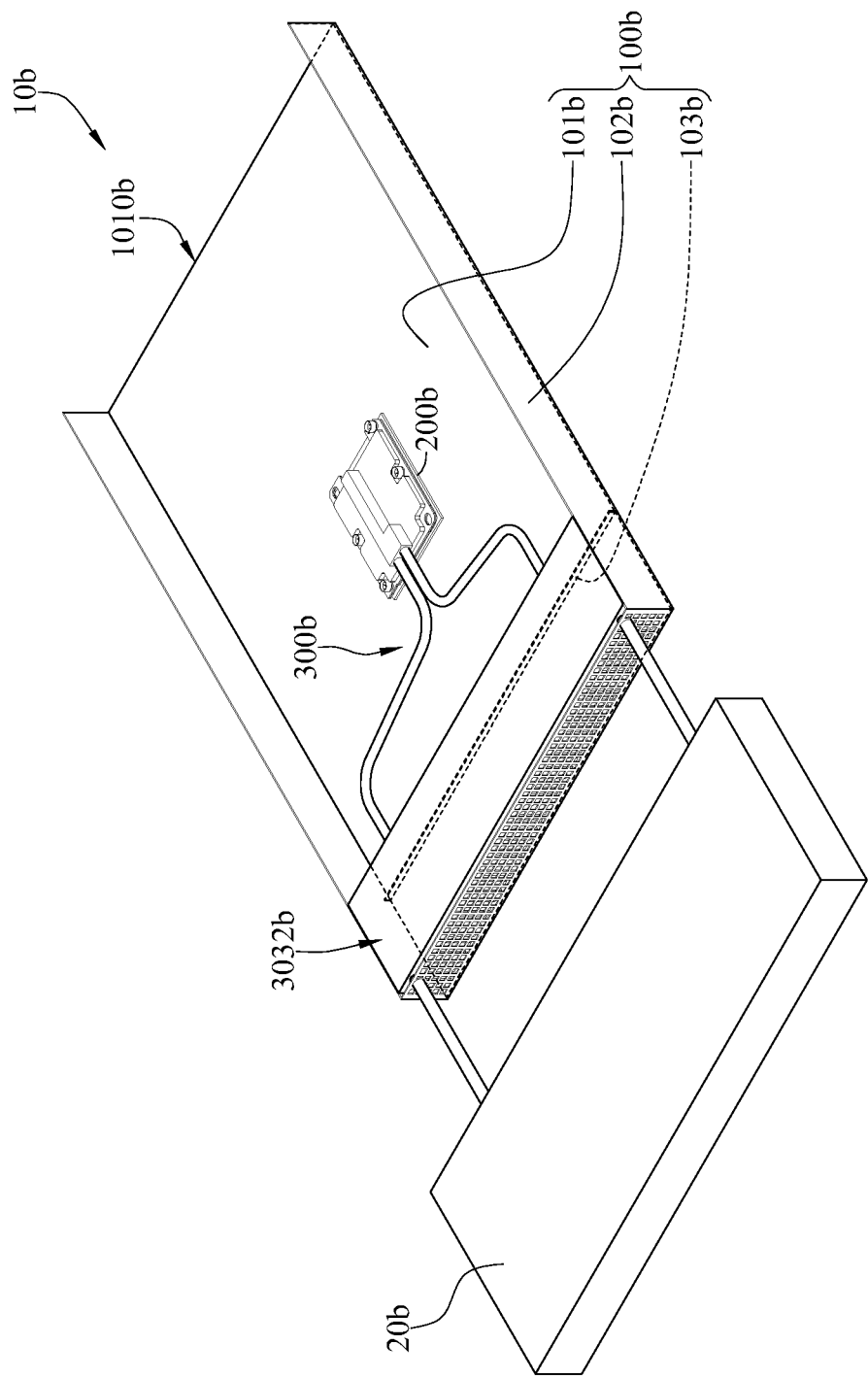
FIG. 5 is a perspective view of an electronic device according to a third embodiment of the invention and an external heat dissipation device.
Figure 6:
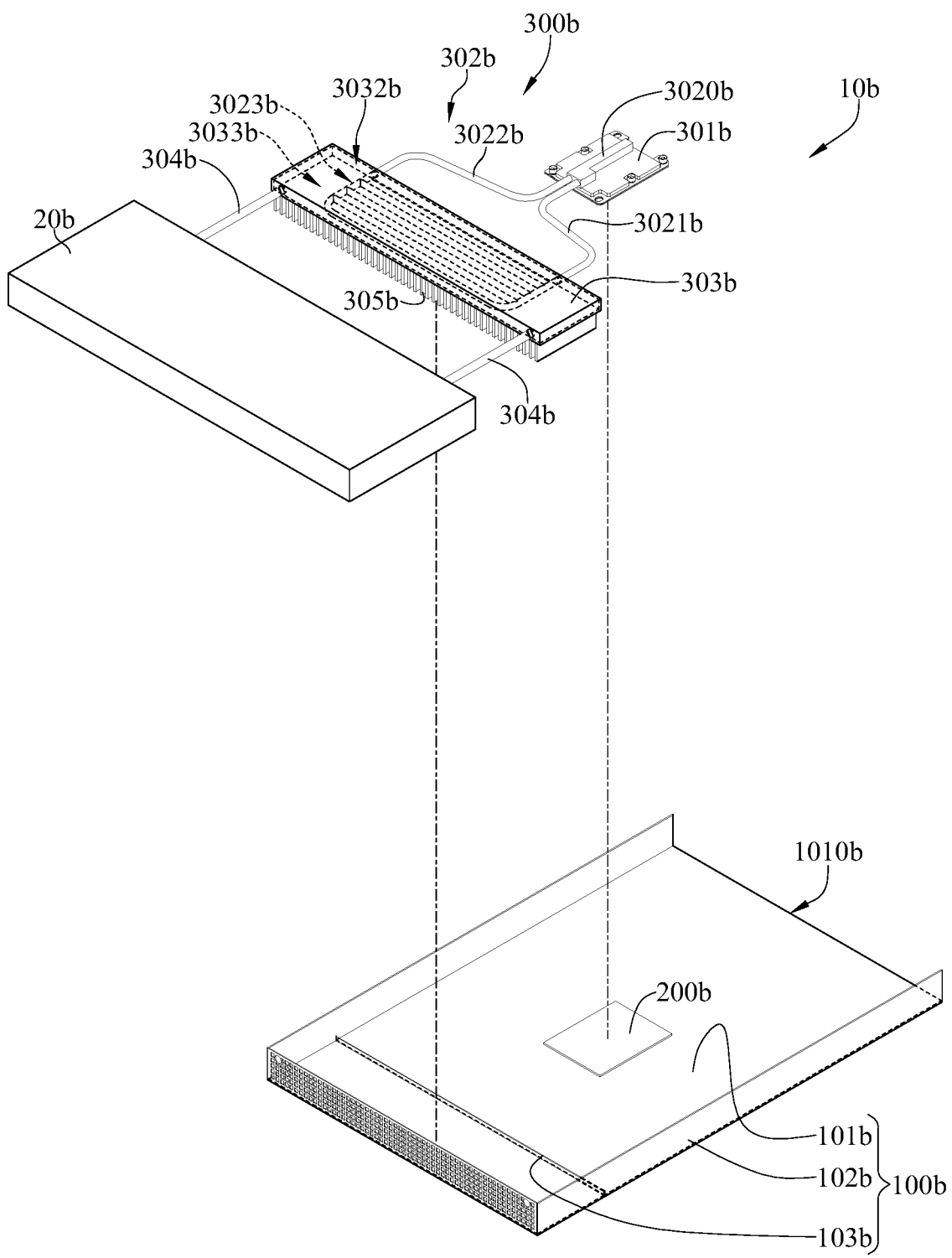
FIG. 6 is an exploded view of the electronic device and the external heat dissipation device in FIG. 5.
Figure 7:
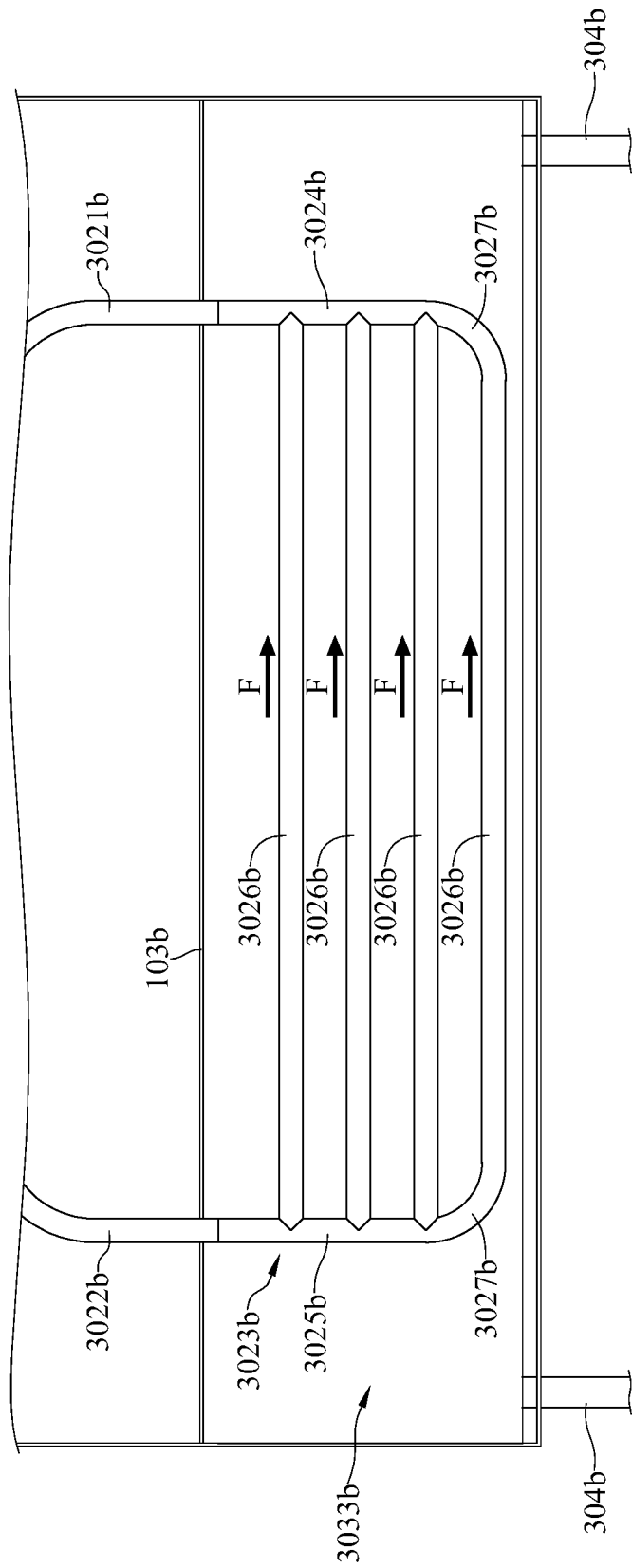
FIG. 7 is a partially enlarged top cross-sectional view of the electronic device in FIG. 5.
Figure 8:
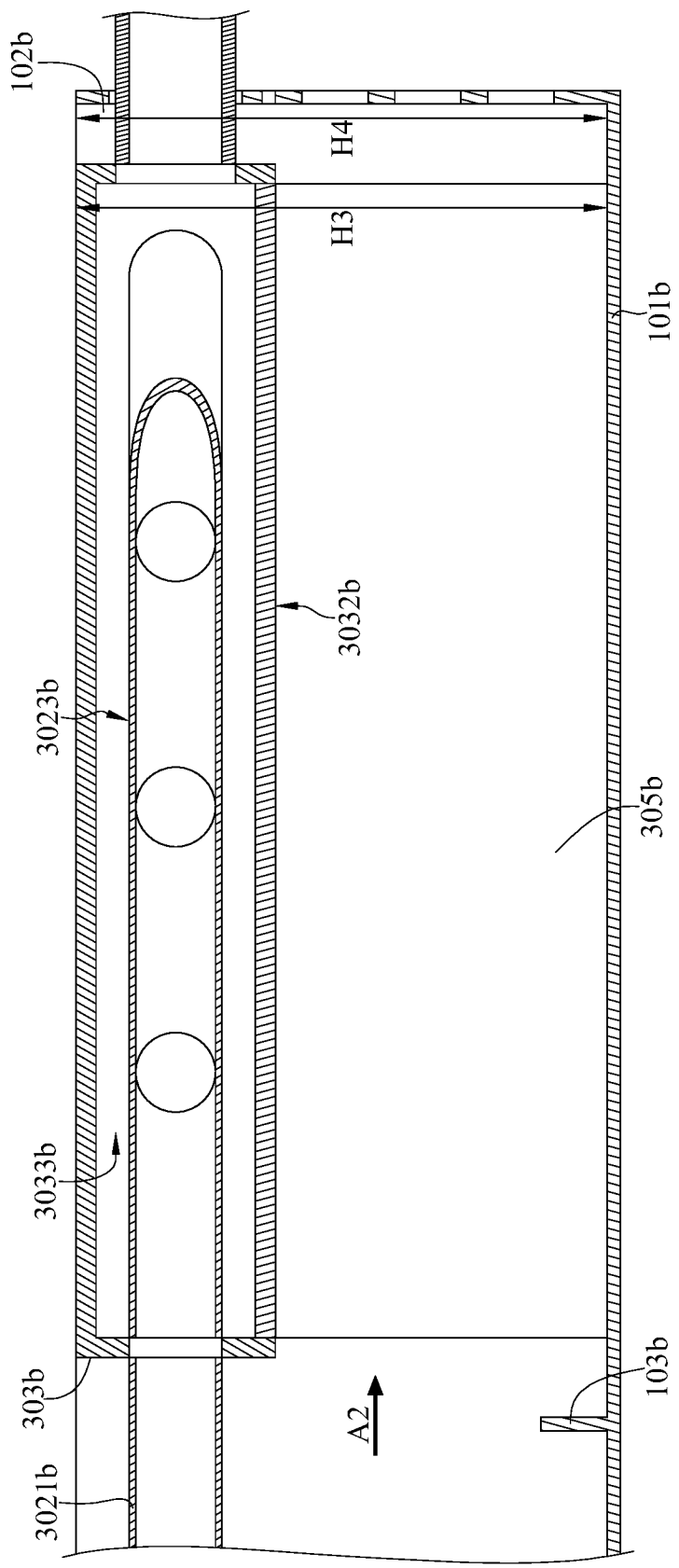
FIG. 8 is a partially enlarged side cross-sectional view of the electronic device in FIG. 5.

The invention is not limited by the structure of the heat dissipation assembly. Please refer to FIGS. 5 to 8, where FIG. 5 is a perspective view of an electronic device 10b according to a third embodiment of the invention and an external heat dissipation device 20b, FIG. 6 is an exploded view of the electronic device 10b and the external heat dissipation device 20b in FIG. 5, FIG. 7 is a partially enlarged top cross-sectional view of the electronic device 10b in FIG. 5, and FIG. 8 is a partially enlarged side cross-sectional view of the electronic device 10b in FIG. 5.

In this embodiment, the electronic device 10b is configured to be connected to the external heat dissipation device 20b, and includes a chassis 100b, a heat source 200b and a heat dissipation assembly 300b. In this embodiment, the electronic device 10b is, for example, a server and is configured to be accommodated in a cabinet.

In this embodiment, the chassis 100b includes a bottom plate 101b, a wall 102b and a partition 103b. The wall 102b stands on a peripheral edge 1010b of the bottom plate 101b, and is, for example, U-shaped. The partition 103b stands on the bottom plate 101b and is connected to two parts of the wall 102b that are parallel to each other. The heat source 200b is disposed on the bottom plate 101b and is, for example, a central processing unit or a graphic processing unit.

In this embodiment, the heat dissipation assembly 300b includes an evaporator 301b, a tubing 302b, a liquid-cooling plate 303b, a fin assembly 305b and two tubes 304b. The evaporator 301b is in thermal contact with the heat source 200b. In this embodiment, a working fluid (not shown) is configured to flow in the tubing 302b, and the tubing 302b includes an evaporation portion 3020b, a first connecting portion 3021b, a second connecting portion 3022b and a condensation portion 3023b, where the working fluid is, for example, a refrigerant. The evaporation portion 3020b is in fluid communication with the condensation portion 3023b via the first connecting portion 3021b and the second connecting portion 3022b. Two opposite ends of the first connecting portion 3021b are respectively in fluid communication with the evaporation portion 3020b and the condensation portion 3023b. Two opposite ends of the second connecting portion 3022b are respectively in fluid communication with the evaporation portion 3020b and the condensation portion 3023b. The evaporation portion 3020b is in thermal contact with the evaporator 301b and is located on a side of the evaporator 301b that is located away from the heat source 200b. In this embodiment, the first connecting portion 3021b and the second connecting portion 3022b are spaced apart from the partition 103b.

The condensation portion 3023b of the tubing 302b includes a first tube part 3024b, a second tube part 3025b and a plurality of connecting tube parts 3026b. Two opposite ends of each connecting tube parts 3026b are respectively in fluid communication with the first tube part 3024b and the second tube part 3025b, and the connecting tube parts 3026b are connected in parallel. The first tube part 3024b and the second tube part 3025b are respectively in fluid communication with the first connecting portion 3021b and the second connecting portion 3022b.

Note that in this embodiment, two opposite ends of the connecting tube parts 3026b that is located farthest away from the first connecting portion 3021b and the second connecting portion 3022b among the connecting tube parts 3026b are respectively connected to the first tube part 3024b and the second tube part 3025b respectively via two curved parts 3027b of the condensation portion 3023b, thereby allowing the working fluid to flow smoothly in the condensation portion 3023b.

Further, as shown in FIG. 7, in this embodiment, extension directions F of the connecting tube parts 3026b are substantially parallel to one another.

In other embodiments, the condensation portion may not include the two curved parts and the connecting tube part that is located farthest away from the first connecting portion and the second connecting portion among the connecting tube parts may be directly connected to the first tube part and the second tube part and may be perpendicular to the first tube part and the second tube part. In other embodiments, the extension directions of the connecting tube parts may be non-parallel to one another.

In other embodiments, the condensation portion may include a single connecting tube part, and the connecting tube part, the first tube part and the second tube part may be connected in serial.

In this embodiment, the liquid-cooling plate 303b has an outer surface 3032b and a liquid-cooling space 3033b. The liquid-cooling plate 303b is disposed on the bottom plate 101b of the chassis 100b and is spaced apart from the heat source 200b. A liquid coolant is configured to flow in the liquid-cooling space 3033b, where the liquid coolant is, for example, water. The entire of the condensation portion 3023b of the tubing 302b is located in the liquid-cooling space 3033b. The partition 103b is located between the heat source 200b and the liquid-cooling plate 303b so as to prevent the liquid coolant leaked from the liquid-cooling space 3033b from further flowing to the heat source 200b. Note that in other embodiments, the chassis may not include the partition.

The fin assembly 305b is in thermal contact with the liquid-cooling plate 303b and protrudes from the outer surface 3032b of the liquid-cooling plate 303b along a direction away from the liquid-cooling space 3033b. In this embodiment, the fin assembly 305b protrudes from a side of the liquid-cooling plate 303b that is located close to the bottom plate 101b and extends to the bottom plate 101b, such that the liquid-cooling plate 303b and the bottom plate 101b are spaced apart from each other. In addition, as shown in FIG. 8, in this embodiment, the fin assembly 305b raises the liquid-cooling plate 303b relative to the bottom plate 101b, and a height H3 of a side of the liquid-cooling plate 303b that is located away from the bottom plate 101b relative to the bottom plate 101b is equal to a height H4 of a side of the wall 102b that is located away from the bottom plate 101b relative to the bottom plate 101b. A hot air A2 is configured to flow through the fin assembly 305b and thus is cooled by the fin assembly 305b, where the hot air A2 is blew by a fan (not shown) disposed inside or outside the electronic device 10b and has absorbed the heat accumulated in the electronic device 10b.

The liquid-cooling space 3033b of the liquid-cooling plate 303b is in fluid communication with the external heat dissipation device 20b via the two tubes 304b. That is, the liquid coolant circulates among the liquid-cooling plate 303b, the two tubes 304b and the external heat dissipation device 20b.

Note that in other embodiments, the height of the side of the liquid-cooling plate that is located away from the bottom plate relative to the bottom plate may be smaller than the height of the side of the wall that is located away from the bottom plate relative to the bottom plate.

Figure 9:
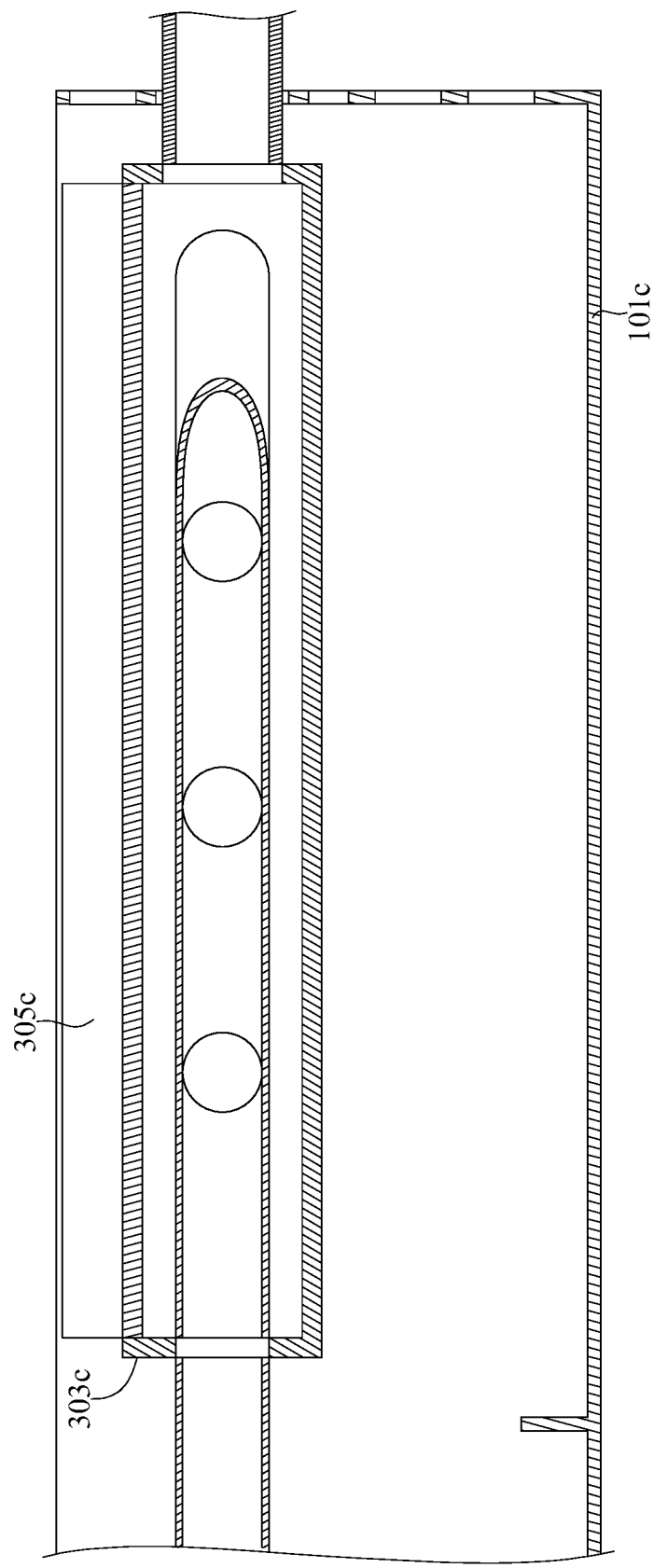
FIG. 9 is a partially enlarged side cross-sectional view of an electronic device according to a fourth embodiment of the invention.

In addition, the fin assembly 305b is not limited to protrude from a side of the liquid-cooling plate 303b that is located close to the bottom plate 101b. Please refer to FIG. 9, there is shown a partially enlarged side cross-sectional view of an electronic device according to a fourth embodiment of the invention. The main difference between the electronic device shown in FIG. 9 and the electronic device shown in FIGS. 5 to 8 is the position of the fin assembly. Thus, only such difference will be described hereinafter, and the remaining part of the electronic device shown in FIG. 9 can be understood through the descriptions made by referring to FIGS. 5 to 8 and thus are not repeatedly described. In this embodiment, the fin assembly 305c protrudes from a side of the liquid-cooling plate 303c that is located away from the bottom plate 101c.

According to the electronic device disclosed by the above embodiments, the fin assembly protrudes from the outer surface of the liquid-cooling plate or the outer surface of the condenser along a direction away from the condensation space or the liquid-cooling space. Thus, the heat dissipation assembly not only can cool the working fluid in the condensation portion or the condensation space via the liquid coolant in the liquid-cooling space, but also can cool the hot air in the chassis via the fin assembly. Since the hot air in the chassis is cooled by the fin assembly that is disposed in the chassis, the maintenance of one electronic device accommodated in the cabinet does not disturb the cooling operation of the fin assemblies of other electronic devices accommodated in the cabinet. Also, there is no need to dispose a liquid-cooling plate on the air outlet of the cabinet. Accordingly, the heat dissipation efficiency of the cabinet accommodating the electronic device is prevented from being reduced during the maintenance of the electronic device.

In addition, since the fin assembly protrudes from a side of the liquid-cooling plate or the condenser that is located close to the bottom plate and extends to the bottom plate to raise the liquid-cooling plate or the condenser, the working fluid in the condensation space is facilitated to flow back to the evaporator. Thus, the heat transferring between the working fluid and the liquid coolant in the liquid-cooling space is enhanced. In this way, the tubes connecting the evaporator and the condensation space are not needed to respectively extending toward two parts of the wall that are parallel to each other to facilitate the working fluid in the condensation space to flow back to the evaporator, thereby reducing the structural complexity of such tubes. Furthermore, with the simplification of the structure of such tubes, the thermally conductive plates can have similar structures and thus can be made from the same mold, thereby reducing the manufacture cost of the condenser.

In an embodiment, the server (i.e., electronic device) disclosed by the invention can be applied to artificial intelligence (AI) computing, edge computing and can be used as 5G server, cloud computing server, or internet of vehicle server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. An electronic device, configured to be connected to an external heat dissipation device, the electronic device comprising:
   a chassis, the chassis comprises a bottom plate and a wall, the wall stands on a peripheral edge of the bottom plate;
   a heat source, disposed on the bottom plate of the chassis; and
   a heat dissipation assembly, comprising:
      two first tubes;
      an evaporator, in thermal contact with the heat source, the evaporator is in fluid communication with the condensation space via the two first tubes;
      a condenser, wherein the condenser has an outer surface, a condensation space and a liquid-cooling space, the outer surface faces away from the condensation space and the liquid-cooling space, the condensation space and the liquid-cooling space are not in fluid communication with each other, the condensation space is in fluid communication with the evaporator, and the liquid-cooling space is configured to be in fluid communication with the external heat dissipation device;
      two second tubes, the liquid-cooling space is configured to be in fluid communication with the external heat dissipation device via the two second tubes, an end portion of each of the two second tubes that is located away from the external heat dissipation device extends from a side of the condenser that is located close to the bottom plate into the condenser so as to be in fluid communication with the liquid-cooling space;
      wherein an end portion of each of the two first tubes that is located away from the evaporator extends from the side of the condenser that is located close to the bottom plate of the chassis into the condenser so as to be in fluid communication with the condensation space; and
      a fin assembly, wherein the fin assembly is in thermal contact with the condenser and protrudes from the outer surface of the condenser along a direction away from the condensation space or the liquid-cooling space, the fin assembly protrudes from the side of the condenser that is located close to the bottom plate and extends to the bottom plate so that the condenser and the bottom plate are spaced apart from each other.

2. The electronic device according to claim 1, wherein a height of a side of the condenser that is located away from the bottom plate relative to the bottom plate is equal to a height of a side of the wall that is located away from the bottom plate relative to the bottom plate.

3. The electronic device according to claim 1, wherein the chassis further comprises a partition, the partition stands on the bottom plate and is connected to two opposite sides of the wall, the partition is located between the heat source and the condenser, the partition has two recesses recessing from a side of the partition that is located away from the bottom plate, and the two first tubes are respectively located in the two recesses.

* * * * *